(12) United States Patent
Kuga

(10) Patent No.: US 9,760,007 B2
(45) Date of Patent: Sep. 12, 2017

(54) SEMICONDUCTOR DEVICE MANUFACTURING METHOD

(71) Applicant: Mitsubishi Electric Corporation, Tokyo (JP)

(72) Inventor: Shoichi Kuga, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/102,329

(22) PCT Filed: Feb. 13, 2014

(86) PCT No.: PCT/JP2014/053334
§ 371 (c)(1),
(2) Date: Jun. 7, 2016

(87) PCT Pub. No.: WO2015/121947
PCT Pub. Date: Aug. 20, 2015

(65) Prior Publication Data
US 2017/0207080 A1    Jul. 20, 2017

(51) Int. Cl.
*G03F 7/16* (2006.01)
*H01L 21/02* (2006.01)
(Continued)

(52) U.S. Cl.
CPC .............. *G03F 7/168* (2013.01); *G03F 7/162* (2013.01); *H01L 21/0206* (2013.01);
(Continued)

(58) Field of Classification Search
None
See application file for complete search history.

(56) References Cited

U.S. PATENT DOCUMENTS 4,113,492 A * 9/1978 Sato .................. B05D 1/40
427/240
4,732,785 A * 3/1988 Brewer ................ H01L 21/316
257/E21.271
(Continued)

FOREIGN PATENT DOCUMENTS

JP    H04-239721 A    8/1992
JP    H08-264418 A    10/1996
(Continued)

OTHER PUBLICATIONS

Notification of Transmittal of Translation of the International Preliminary Report on Patentability and Translation of Written Opinion of the International Searching Authority; PCT/JP2014/053334 issued on Aug. 25, 2016.
(Continued)

*Primary Examiner* — Mary Wilczewski
*Assistant Examiner* — Erik T Peterson
(74) *Attorney, Agent, or Firm* — Studebaker & Brackett PC

(57) ABSTRACT

A semiconductor device manufacturing method of the present invention includes a coating step of coating a front surface of a wafer with a material containing a solvent, a volatilization step of volatilizing the solvent by heating the material, and a rinse step of jetting an edge rinse solution for removing the material from a first nozzle to a peripheral portion of the front surface of the wafer while rotating the wafer.

3 Claims, 3 Drawing Sheets

(51) Int. Cl.
*H01L 21/027* (2006.01)
*H01L 21/3105* (2006.01)
*H01L 21/67* (2006.01)

(52) U.S. Cl.
CPC .... *H01L 21/0273* (2013.01); *H01L 21/02087* (2013.01); *H01L 21/31058* (2013.01); *H01L 21/67051* (2013.01); *H01L 21/67103* (2013.01); *H01L 2223/54493* (2013.01)

(56) References Cited

U.S. PATENT DOCUMENTS

| | | | | |
|---|---|---|---|---|
| 5,688,411 | A * | 11/1997 | Kutzsuzawa | B05C 9/12 134/32 |
| 6,485,576 | B1 * | 11/2002 | Huang | B08B 3/02 134/2 |
| 6,936,546 | B2 * | 8/2005 | Robbins | H01J 37/32366 204/298.07 |
| 6,983,755 | B2 * | 1/2006 | Nam | B08B 3/12 134/103.2 |
| 2001/0017191 | A1 * | 8/2001 | Hashimoto | H01L 21/67051 156/345.21 |
| 2004/0226916 | A1 * | 11/2004 | Kobayashi | H01L 21/6708 216/83 |
| 2004/0250839 | A1 * | 12/2004 | Robertson | B08B 3/02 134/33 |
| 2005/0067100 | A1 * | 3/2005 | Kobayashi | C03C 17/002 156/345.11 |
| 2007/0082134 | A1 | 4/2007 | Fukuda et al. | |
| 2007/0128554 | A1 | 6/2007 | Kawamura et al. | |
| 2008/0280054 | A1 * | 11/2008 | Ogata | H01L 21/67051 427/425 |

FOREIGN PATENT DOCUMENTS

| | | |
|---|---|---|
| JP | H09-162116 A | 6/1997 |
| JP | H07-211615 A | 8/1999 |
| JP | 2001-326172 A | 11/2001 |
| JP | 2007-134671 A | 5/2007 |
| JP | 2007-142181 A | 6/2007 |
| JP | 2008-205286 A | 9/2008 |
| JP | 2010-141162 A | 6/2010 |

OTHER PUBLICATIONS

An Office Action; "Notification of Reason for Rejection" issued by the Japanese Patent Office on Jan. 10, 2017, which corresponds to Japanese Patent Application No. 2015-562623 and is related to U.S. Appl. No. 15/102,329; with English language partial translation.

International Search Report issued in PCT/JP2014/053334; mailed Apr. 28, 2014.

Office Action; "Decision of Final Rejection" issued by the Japanese Patent Office on Jul. 4, 2017, which rresponds to Japanese Patent Application No. 2015-562623 and is related to U.S. Appl. No. 15/102,329; with partial English language translation.

* cited by examiner

SEMICONDUCTOR DEVICE MANUFACTURING METHOD

TECHNICAL FIELD

This invention relates to a semiconductor device manufacturing method used for manufacturing, for example, a large-scale integrated circuit (LSI).

BACKGROUND

Patent Literature 1 discloses dissolution and removal of a peripheral edge of a resist (material) formed on a front surface of a wafer.

PRIOR ART

Patent Literature

Patent Literature 1: Japanese Patent Laid-Open No. H8-264418

SUMMARY

Technical Problem

A material formed on a peripheral portion of a wafer may act as a contamination source in a subsequent step such as an exposure step or may attach to a wafer transport arm to cause the wafer to fall from the transport arm. It is, therefore, desirable to remove the material. However, even if the material on the peripheral portion of the wafer is removed by jetting a rinse solution to the material while the wafer is being rotated, the material formed on a central portion of the wafer spreads to the peripheral portion. Thus there is a problem that the material formed on the peripheral portion cannot be removed.

There is, in particular, a problem that when the viscosity of the material is high or when the volatility of a solvent contained in the material is low, the spread of the material to the peripheral portion by centrifugal force accompanying the rotation of the wafer is markedly large.

The present invention has been achieved to solve the above-described problem, and an object of the present invention is to provide a semiconductor device manufacturing method capable of unfailingly removing a material formed on a peripheral portion of a front surface of a wafer.

Means for Solving the Problems

A semiconductor device manufacturing method of the claimed invention includes a coating step of coating a front surface of a wafer with a material containing a solvent, a volatilization step of volatilizing the solvent by heating the material, and a rinse step of jetting an edge rinse solution for removing the material from a first nozzle to a peripheral portion of the front surface of the wafer while rotating the wafer.

Other features of the present invention will be made clear below.

Advantageous Effects of Invention

According to the present invention, the solvent in the resist is volatilized, so that the material formed on the peripheral portion of the front surface of the wafer can be unfailingly removed.

DESCRIPTION OF EMBODIMENTS

Figure 1:
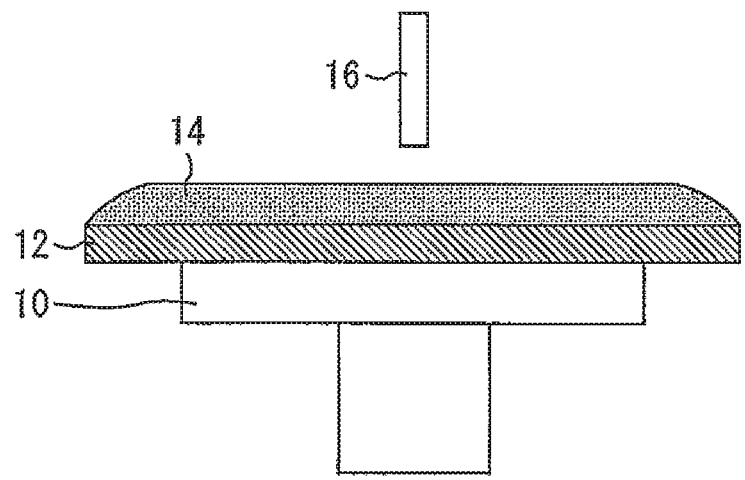
FIG. 1 is a diagram explaining coating step.

A semiconductor device manufacturing method according to an embodiment of the present invention will be described with reference to the drawings. Components identical or corresponding to each other are assigned the same reference characters, and repeated description of them is avoided in some cases.

Embodiments

First, as shown in FIG. 1, a wafer 12 is vacuum-attracted to a spin chuck 10. A coating of a material 14 is then applied to a front surface of the wafer 12. More specifically, to the wafer 12 rotated with the spin chuck 10, the material 14 is supplied from a nozzle 16 provided above the wafer 12. This step is called a coating step. The material 14 is a resist containing a solvent.

Figure 2:
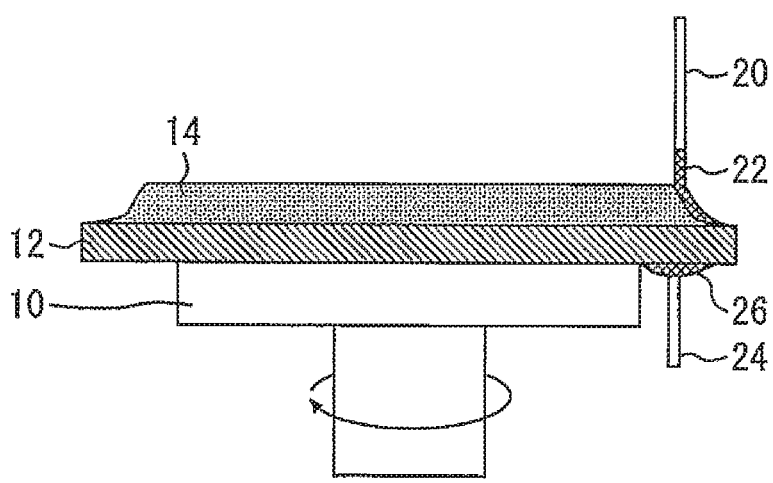
FIG. 2 is a diagram explaining preliminary rinse step.

Subsequently, the process advances to a preliminary rinse step. FIG. 2 is a diagram for explaining the preliminary rinse step. In the preliminary rinse step, an edge rinse solution is jetted to a peripheral portion of the front surface of the wafer 12, and a back rinse solution to a back surface of the wafer 12, while the wafer 12 is being rotated with the rotation of the spin chuck 10.

More specifically, an edge rinse solution 22 for dissolving and removing the material 14 is jetted from a first nozzle 20 provided above the wafer 12. The edge rinse solution 22 is jetted to the peripheral portion of the front surface of the wafer 12. Also, a back rinse solution 26 for cleaning the back surface of the wafer 12 is jetted from a second nozzle 24 provided below the wafer 12. The back rinse solution 26 is jetted to the back surface of the wafer 12. Each of the edge rinse solution 22 and the back rinse solution 26 is an organic solvent such as γ-butyrolactone or NMP. The edge rinse solution 22 and the back rinse solution 26, however, are not particularly limited to this.

In the preliminary rinse step, the material 14 spreads concentrically outward with the rotation of the wafer 12. Therefore, the material 14 on the peripheral portion of the front surface of the wafer 12 cannot be completely removed. The reason that the material 14 spreads outward in the preliminary rinse step is that the solvent remains in the material 14.

Figure 3:
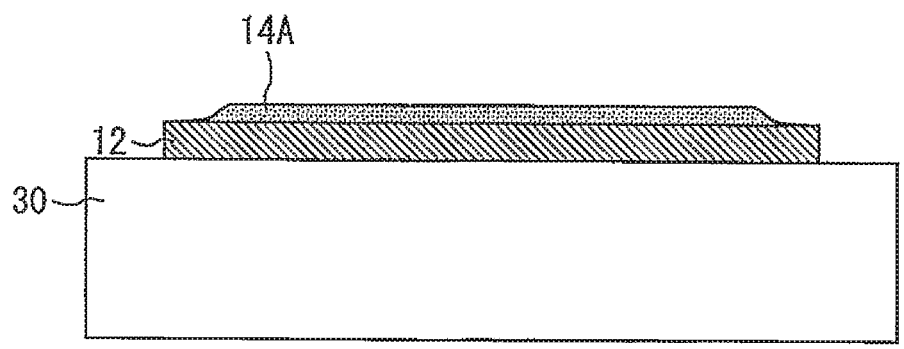
FIG. 3 is a diagram explaining volatilization step.

Then the process advances to a volatilization step. FIG. 3 is a diagram for explaining the volatilization step. In the volatilization step, the wafer 12 is first transported onto a hot plate 30. The material 14 is heated (bake-dried) with the hot plate 30 to volatilize the solvent. A material 14A from which the solvent has volatilized has a thickness slightly smaller than that of the material 14 shown in FIG. 2.

Figure 4:
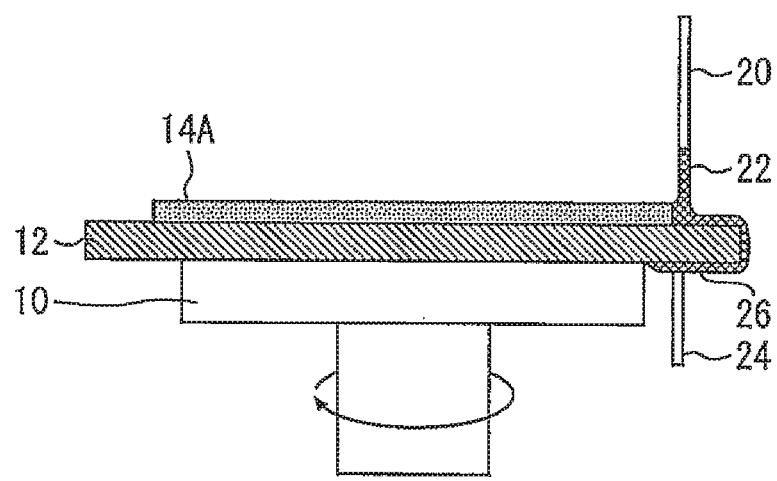
FIG. 4 is a diagram explaining rinse step.

Then the process advances to a rinse step. FIG. 4 is a diagram for explaining the rinse step. In the rinse step, the wafer 12 is first transported onto the spin chuck 10. The edge rinse solution 22 for removing the material 14A is jetted from the first nozzle 20 to the peripheral portion of the front surface of the wafer 12 while the wafer 12 is being rotated. At this time, since the solvent in the material 14A has already volatilized, the material 14A is dry and does not spread outward. Therefore, the portion of the material 14A formed on the peripheral portion of the front surface of the wafer 12 can be unfailingly removed.

In the rinse step, the back rinse solution 26 for cleaning the back surface of the wafer 12 is also jetted from the second nozzle 24 to the back surface of the wafer 12. The back surface of the wafer 12 can thus be cleaned.

Figure 5:
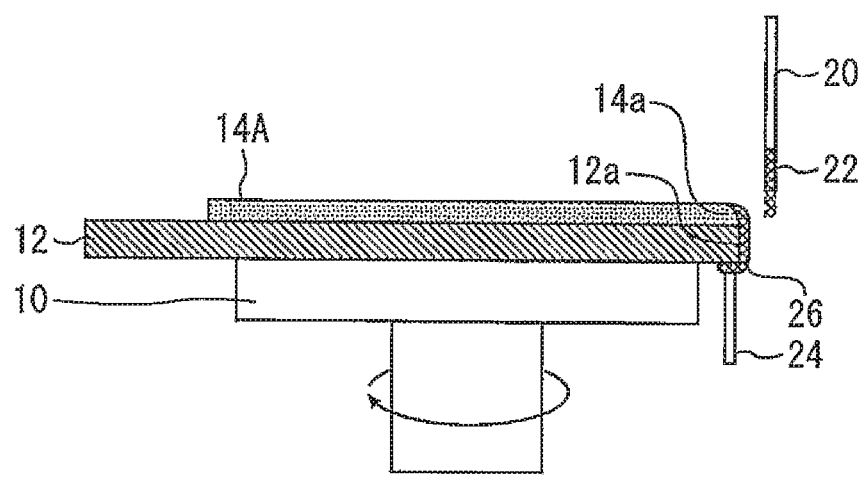
FIG. 5 is a diagram showing the removal of the orientation flat adjacency material.
Figure 6:
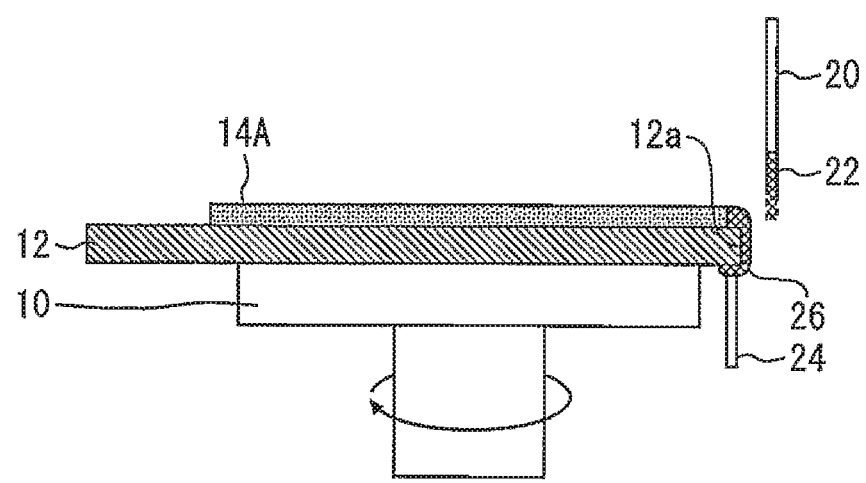
FIG. 6 is a diagram showing the removal of the orientation flat adjacency material.

Further, in the rinse step, a portion of the material 14A adjacent to the orientation flat as viewed in plan (hereinafter referred to as "orientation flat adjacency material 14a") is removed. FIGS. 5 and 6 are diagrams showing removal of the orientation flat adjacency material 14a. As shown in FIG. 5, the position of the first nozzle 20 is adjusted so that the edge rinse solution 22 strikes the material applied to the peripheral portion of the wafer. Therefore, the edge rinse solution 22 does not strike the orientation flat adjacency material 14a.

In the embodiment of the present invention, the second nozzle 24 is provided closer to a center of the wafer 12 (a center of the spin chuck 10) than the first nozzle 20, so that the back rinse solution 26 jetted from the second nozzle 24 strikes the back surface of the wafer 12 at all times while the wafer 12 is being rotated. The above-described orientation flat adjacency material 14a is removed by causing the back rinse solution 26 jetted from the second nozzle 24 to go around to the front surface of the wafer 12. FIG. 5 shows a state where the back rinse solution 26 goes around to the front surface side of the wafer 12 to remove part of the orientation flat adjacency material 14a. FIG. 6 shows a state where the orientation flat adjacency material 14a is removed with further progress in removal of the orientation flat adjacency material 14a from the state shown in FIG. 5.

Preferably, in order to cause the back rinse solution 26 jetted from the second nozzle 24 to go around to the front surface of the wafer 12, the back rinse solution is jetted at a flow rate of 100 to 150 ml/min from the second nozzle 24 while the wafer 12 is being rotated at 700 to 1000 rpm. If the rotational speed of the wafer 12 is lower than the range shown above, the amount of removal of the material 14A other than the orientation flat adjacency material 14a increases abruptly. On the other hand, if the rotational speed of the wafer 12 is higher than the range shown above, the back rinse solution 26 does not go around to the front surface of the wafer 12.

Figure 7:
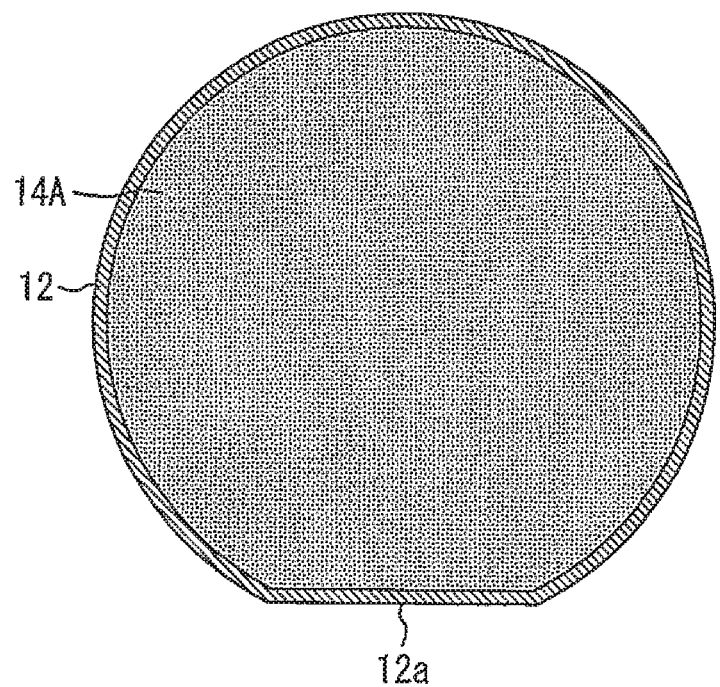
FIG. 7 is a plan view of the wafer after the rinse step.

FIG. 7 is a plan view of the wafer 12 after the rinse step. Removal of the material on the peripheral portion of the front surface of the wafer 12 is completed. Removal of the orientation flat adjacency material is also completed. As a result, the outer portion of the wafer 12 is entirely exposed.

After the completion of the above-described steps, the wafer 12 is transported to an exposure apparatus and a well-known lithography process is performed on the wafer 12. Thus, the semiconductor device manufacturing method according to the embodiment of the present invention enables unfailingly removing the material formed on the peripheral portion of the front surface of the wafer 12.

The most important feature of the present invention resides in providing the volatilization step to prevent the material 14A from being spread outward by centrifugal force in the rinse step. Accordingly, the semiconductor device manufacturing method according to the embodiment of the present invention can be variously modified within such a scope as not to depart from this feature.

For example, the advantage of the present invention can also be obtained by performing the above-described steps on a wafer with a notch. In a case where there is no need to remove a portion of the material adjacent to the orientation flat or a notch as viewed in plan, it is not necessary to cause the back rinse solution 26 jetted from the second nozzle 24 to go around to the front surface of the wafer 12. In this case, the rotational speed of the wafer 12 in the rinse step and the flow rate of the back rinse solution 26 jetted from the second nozzle 24 are not limited to any particular values. Also, the second nozzle 24 itself may be removed.

The preliminary rinse step between the coating step and the volatilization step is not indispensable. The preliminary rinse step is provided for the purpose of preventing the material from attaching to a transport arm, preventing the wafer from attaching to the transport arm and preventing the wafer from falling from the transport arm during transport of the wafer 12 to the hot plate 30 after the coating step. If there is no possibility of the above-described detrimental effects, the preliminary rinse step is not indispensable. For example, transport of the wafer at the time of advancement from the coating step to the volatilization step can be eliminated by employing a spin chuck capable of heating and using the spin chuck as a hot plate.

In the volatilization step, the wafer 12 may be heated by certain means other than the hot plate 30. For example, the wafer 12 may be introduced into a heating furnace, and a heating wire for heating the wafer 12 may be provided in the chamber in which the coating step is performed. The material 14 is not limited to the resist. The material 14 may be polyimide for example. Therefore, the step after the completion of the rinse step is not limited to the exposure step.

DESCRIPTION OF SYMBOLS 10 spin chuck, 12 wafer, 14,14A material, 14a orientation flat adjacency material, 16 nozzle, 20 first nozzle, 22 edge rinse solution, 24 second nozzle, 26 back rinse solution, 30 hot plate

The invention claimed is:
1. A semiconductor device manufacturing method comprising:
    a coating step of coating a front surface of a wafer with a material containing a solvent;
    a volatilization step of volatilizing the solvent by heating the material; and
    a rinse step of jetting an edge rinse solution for removing the material from a first nozzle to a peripheral portion of the front surface of the wafer while rotating the wafer, wherein
    the wafer has an orientation flat or a notch,
    in the rinse step, a back rinse solution for cleaning a back surface of the wafer is jetted from a second nozzle to the back surface of the wafer, and
    in the rinse step, a portion of the material adjacent to the orientation flat or the notch as viewed in plan is removed by causing the back rinse solution jetted from the second nozzle to go around to the front surface of the wafer,
    further comprising, between the coating step and the volatilization step, a preliminary rinse step of jetting the edge rinse solution to the peripheral portion of the front surface of the wafer and jetting the back rinse solution to the back surface of the wafer while rotating the wafer,
    wherein the wafer is transported to a hot plate after the preliminary rinse step, and the material is heated with the hot plate in the volatilization step.

2. The semiconductor device manufacturing method according to claim 1, wherein, in the rinse step, the back rinse solution is jetted at a flow rate of 100 to 150 ml/min from the second nozzle while the wafer is being rotated at 700 to 1000 rpm.

3. The semiconductor device manufacturing method according to claim 1, wherein the material is a resist or polyimide.

\* \* \* \* \*